(12) United States Patent
Klammler et al.

(10) Patent No.: US 12,044,710 B2
(45) Date of Patent: Jul. 23, 2024

(54) DETECTION OF A DIRECT CURRENT COMPONENT IN AN INDUCTIVE DEVICE

(71) Applicant: Siemens Energy Global GmbH & Co. KG, Munich (DE)

(72) Inventors: Franz Klammler, Passail (AT); Mario Scala, Graz (AT)

(73) Assignee: Siemens Energy Global GmbH & Co. KG, Munich (DE)

( * ) Notice: Subject to any disclaimer, the term of this patent is extended or adjusted under 35 U.S.C. 154(b) by 292 days.

(21) Appl. No.: 17/609,463

(22) PCT Filed: May 4, 2020

(86) PCT No.: PCT/EP2020/062277
§ 371 (c)(1),
(2) Date: Nov. 8, 2021

(87) PCT Pub. No.: WO2020/225193
PCT Pub. Date: Nov. 12, 2020

(65) Prior Publication Data
US 2022/0221493 A1 Jul. 14, 2022

(30) Foreign Application Priority Data

May 8, 2019 (EP) .................................. 19173222

(51) Int. Cl.
*G01R 19/00* (2006.01)
*G01H 13/00* (2006.01)
*G01R 23/16* (2006.01)

(52) U.S. Cl.
CPC ......... *G01R 19/0015* (2013.01); *G01H 13/00* (2013.01); *G01R 23/16* (2013.01)

(58) Field of Classification Search
CPC ..... G01R 19/0015; G01R 23/16; G01H 13/00
USPC .................................................. 324/76.47
See application file for complete search history.

(56) References Cited

U.S. PATENT DOCUMENTS

| | | | | |
|---|---|---|---|---|
| 4,258,423 A | * | 3/1981 | Lane | .................... G01R 23/167 324/76.47 |
| 4,556,842 A | * | 12/1985 | Rosswurm | ............... H02H 3/50 327/552 |
| 2009/0299666 A1 | * | 12/2009 | Kang | .................. G01R 19/0015 702/191 |
| 2019/0204370 A1 | * | 7/2019 | Virtala | ............... G01R 19/0007 |

FOREIGN PATENT DOCUMENTS

| | | |
|---|---|---|
| CN | 109459613 A | 3/2019 |
| EP | 2905627 A1 | 8/2015 |
| EP | 3133632 A1 | 2/2017 |

OTHER PUBLICATIONS

Translation of EP2905627 A 1 (Year: 2015).*

* cited by examiner

*Primary Examiner* — Christopher P McAndrew
(74) *Attorney, Agent, or Firm* — Laurence A. Greenberg; Werner H. Stemer; Ralph E. Locher

(57) ABSTRACT

A method for detecting a direct current component in an inductive device, for example in a transformer or choke, includes using a computer for recording an oscillation signal, either of sound emitted from the device or of mechanical oscillation of the device, determining the frequency range of the oscillation signal, determining the value of at least one odd frequency in the frequency range, comparing the value of the odd frequency with the value of at least one even frequency in the frequency range, and determining a direct current component when the value of the odd frequency differs from the even frequency by a predefined amount. The method can be carried out without measuring equipment in the interior of an inductive device and without the involvement of an expert. A computer program product for carrying out the method is also provided.

9 Claims, No Drawings

DETECTION OF A DIRECT CURRENT COMPONENT IN AN INDUCTIVE DEVICE

FIELD AND BACKGROUND OF THE INVENTION

The invention relates to a method for detecting a direct current component in an inductive device, for example in a transformer or an inductor.

PRIOR ART

Direct currents are disruptive in an AC voltage energy supply network since they may result in increased losses and in unpleasant noises in inductive devices because the direct current results in magnetization of the core of the inductive device, which is intensified by the use of magnetically highly permeable cores. There are various causes of direct currents in the AC voltage energy supply network: they may originate from renewable energy sources or their power converters or may be caused by geomagnetic influences, such as the solar wind, in which case the cause cannot be located locally here. The noises may also be caused by the inductive device itself: by remanence effects of the core of the transformer or of the inductor, by the so-called inrush current or other switching operations, or by mechanically inadequately connected components of the inductive device such as pumps, fans or other additional assemblies containing movable parts.

Direct currents in an inductive device are detected by means of direct or indirect electrical measurement at the inductive device, for instance using the Faraday effect or with the aid of light guides, for example at the star point of a transformer, if accessible. These electrical measurements are complicated in terms of apparatus in the sense that such measuring devices must already be present in the inductive device and can be retrofitted only in a very complicated manner. An expert is needed to evaluate acoustic measurement series recorded at the inductive device in order to assess any direct current component.

SUMMARY OF THE INVENTION

An object of the invention is therefore to provide a method for detecting a direct current component in an inductive device, which avoids the disadvantages mentioned above. In particular, the method is intended to manage without measuring devices inside an inductive device and without consulting an expert.

This object is achieved, according to the invention, by means of a method as described below by virtue of the following method steps using a computer:
  recording an oscillation signal, either of the sound emitted by the device or of the mechanical oscillation of the device,
  determining the frequency spectrum of the oscillation signal,
  determining the value of at least one odd frequency in the frequency spectrum,
  comparing the value of the odd frequency with the value of at least one even frequency in the frequency spectrum,
  determining a direct current component if the value of the odd frequency differs by a predefined extent from the value of the even frequency.

The unpleasant noises are produced by asymmetrical oscillations. Asymmetrical oscillations are understood as meaning odd harmonic oscillations above the fundamental oscillation. The fundamental oscillation at the fundamental frequency is referred to as the first harmonic oscillation, first harmonic for short. The second harmonic oscillation, second harmonic for short, is at twice the frequency of the fundamental oscillation, the third harmonic oscillation, third harmonic for short, is at three times the frequency of the fundamental oscillation, etc. The second, fourth, sixth, eighth, etc. harmonics are referred to as even harmonics, as symmetrical oscillations or as oscillations at an even frequency. The third, fifth, seventh, ninth, etc. harmonics are referred to as odd harmonics, as asymmetrical oscillations or as oscillations at an odd frequency.

As a result of the fact that one or more asymmetrical oscillations which cause the disruptive noises are detected, it is possible to draw a conclusion on the presence of a direct current component in the inductive device. By means of the comparison with one or more symmetrical oscillations, it is possible to exclude the fact that this is a "normal", that is to say relatively low, proportion of asymmetrical oscillations which may also be present without disruptive noises.

In this case, the computer is used in any case to determine the frequency spectrum, to determine the value of at least one odd frequency in the frequency spectrum and to compare the value of the odd frequency with the value of the at least one even frequency in the frequency spectrum. The computer will generally also assess the difference between the value of the odd frequency and the value of the even frequency, for instance on the basis of predefined limit values. If the value of the odd and of the even frequency is displayed to a user, the user could also himself assess—possibly on the basis of further displayed information—whether the difference is sufficient for the presence of a direct current component.

However, the method is mainly intended to be a fully automatic method in which the oscillation signal is recorded and the frequency spectrum is then calculated by a computer with an appropriate evaluation program, the value of at least one odd frequency and of at least one even frequency is then determined therefrom, the difference between the values of the even and odd frequencies is calculated (wherein, in the case of a plurality of even and/or odd frequencies, an averaged value of the frequency is calculated in advance) and finally the determined difference is compared with a predefined difference value: there is a direct current component if the determined difference is above the predefined difference value.

One preferred embodiment of the method according to the invention provides for a probability of the presence of a direct current component to be stated for the determination of a direct current component, wherein the probability is higher, the greater the difference between the value of the at least one odd frequency and the value of the at least one even frequency.

In this case, provision may be made, for example, for different differences to be accordingly predefined for different probabilities of the presence of a direct current component, that is to say different differences between the value of the at least one odd frequency and the value of the at least one even frequency.

One preferred embodiment of the method according to the invention provides for the value of one or more even frequencies to be compared with a value of the noise of the oscillation signal, and for the presence of a direct current component to be provided with an uncertainty factor in the case of a difference which is smaller than a predefined difference between the values. In this manner, the usability of the even harmonics when assessing the presence of a direct current component is checked. If the value of the intensity of the even frequency differs only slightly from that of the intensity of the noise of the overall signal, the noise component of the measurement signals makes the evaluation uncertain.

One preferred embodiment of the method according to the invention provides for the two largest values of the even frequencies to be related to one another, and for the presence of a direct current component to be provided with an uncertainty factor in the event of a ratio greater than a predefined ratio. This is because, if the difference between these two even frequencies is very large, it is probable that there is interference or resonance of the even frequencies. This may in turn distort the evaluation in order to determine whether there is a direct current component.

One preferred embodiment of the method according to the invention provides for the two largest values of the odd frequencies, which are not equal to the fundamental frequency, to be related to one another, and for the presence of a direct current component to be provided with an uncertainty factor in the event of a ratio greater than a predefined ratio. In this case, a dominant occurrence of a frequency that is not equal to the fundamental frequency is assumed, which indicates interference or resonance of the odd frequencies. This may again likewise distort the evaluation in order to determine whether there is a direct current component.

One preferred embodiment of the method according to the invention provides for the value of the fundamental oscillation to be related to the value of the remaining measured frequencies, and for the presence of a direct current component to be provided with an uncertainty factor in the event of a ratio greater than a predefined ratio. This is because, if there is dominance of the fundamental oscillation, it is probable that the interfering noise is current noise. This can be confirmed if the value of the fundamental oscillation likewise increases in the case of a higher load current.

One preferred embodiment of the method according to the invention provides for the presence of a direct current component to be assessed with a lower probability if the value of the odd frequency differs by a predefined extent from the value of the even frequency and this difference increases with increasing load current. If odd harmonics therefore occur with increasing load current, it is more probable that these can be attributed to loose parts inside or outside the inductive device, for example inside or outside the transformer tank.

Provision may be made for the method according to the invention to be repeated with a different number of even and/or odd frequencies, and for a deviation when determining a direct current component to be used as a measure of the robustness of the result.

Since the method according to the invention is generally carried out by a computer, the subject matter of the invention also comprises a computer program product comprising a program which can be directly loaded into a processor of a computer, having program means for carrying out all steps of the method according to the invention when the program is executed by the processor. The computer program product may be, for example, a data storage medium which stores a corresponding computer program, or may be a signal or a data stream which can be loaded into the processor via a data connection.

The computer program can therefore cause an oscillation signal, either of the sound emitted by the device or of the mechanical oscillation of the device, to be recorded by means of corresponding measuring devices which are provided in the computer or are connected to the latter. The computer then determines the frequency spectrum of the oscillation signal and the value of at least one odd frequency in the frequency spectrum. The value of the odd frequency is then compared with the value of at least one even frequency in the frequency spectrum, wherein the computer determines a direct current component when the value of the odd frequency differs by a predefined extent from the value of the even frequency. Accordingly, the computer can carry out the method steps in the dependent claims.

The computer may be, in particular, a portable computer or a smartphone.

The present invention makes it possible to carry out an evaluation with regard to the presence of a direct current component without having information relating to the operating state and the supply (current and voltage) of the inductive device and without modeling of the spectra which is derived therefrom, that is to say without a desired/actual comparison.

DETAILED DESCRIPTION OF THE INVENTION

The invention is now explained in more detail on the basis of exemplary embodiments. These embodiments are exemplary and are intended to explain the concept of the invention, but not to restrict it in any way or to conclusively describe it at all. The starting point for the method according to the invention is an existing so-called narrowband analysis of an oscillation or noise signal from a transformer or an inductor. The following variables are used in this case:

| Variable | Designation | Explanation |
|---|---|---|
| $S_{xN}$ | signal value | Magnitude of the individual component or of the signal, linearly represented (no dB value); x represents e (even), o (odd) or n (noise) |
| eN | even | Type of spectral signal component |
| oN | odd | |
| nN | noise | |
| N | ordinal number | Ordinal number of the signal: N = 1, 2, 3, ... $N_{max}$ ≈ 6 (max. 10) N = 1: fundamental oscillation, above it: harmonic |
| $f_{eN}$ | even frequency | $f_{eN} = 50^1 \cdot 2 \cdot N$ in the case of a network voltage frequency of 50 Hz |
| $f_{oN}$ | odd frequency | $f_{oN} = 50^1 \cdot 2 \cdot (N + 1/2)$ in the case of a network voltage frequency of 50 Hz |
| $f_{neN}$ | noise frequency | $f_{nN-} = 50^1 \cdot 2 \cdot (N - 1/4)$ and $f_{nN+} = 50^1 \cdot 2 \cdot (N + 1/4)$ $S_{nN} = (S_{fnN-} + S_{fN+})/2$ in the case of a network voltage frequency of 50 Hz |
| $A_{lin}$ | linear factor of the A-assessment | f-dependent A-assessment from acoustics, delogarithmized |
| $S_{xNA}$ | S, A-assessed | $S_{xNA} = S_{xN} \cdot A(f_{xN})$ |
| $S_{xTotA}$ | S-total, A-assessed | Summed signal of the individual coponents $S_{xN}$ $$S_{x-TotA} = \sum_{N=1}^{N_{max}} S_{xN} \cdot A(f_{xN})$$ |
| $Se_{Tot-1, A}$ | S-total without fundamental oscillation, A-assessed | Summed signal of the individual components $S_{xN}$ $$S_{eTot-1,A} = \sum_{N=2}^{N_{max}} S_{xN} \cdot A(f_{xN})$$ |

-continued

| Variable | Designation | Explanation |
|---|---|---|
| | | lg ≡ log₁₀ |
| | | R ≡ ratio |
| | | $S_{xN} \equiv S_{fxN}$ |

The index 1 indicates that the value 50 should be used for a network voltage frequency of 50 Hz. In the case of a different network voltage frequency, for example in case of a network voltage frequency of 60 Hz, the corresponding frequency should then be used, for example 60 instead of 50. The exact value of the network voltage frequency should be ensured from the frequency of the individual $S_{eN}$ values up to $N_{max}$.

The even frequency components $S_{eN}$ of an oscillation or of a noise which are cited below are typical of a transformer (or an inductor.) They are intended to clearly stand out from the noise which is described below using the signal components with the noise frequency $S_{nN}$. Part of the method in this exemplary embodiment involves detecting and/or filtering out measurement results which cannot be used.

More than 30 seconds are recommended as the duration for measuring an oscillation or noise signal. If there is a suspicion of interfering noises which are not based on a direct current component, a longer measurement duration would be advisable, for instance more than one minute.

The criteria for the usability of the measurement signals are used first.

In this case, the usability of the even measurement signals can be determined as the first criterion by determining the signal-to-noise ratio in dB, specifically first of all for a plurality of individual signals at an even frequency:

$$R_{Noise,eN}[dB] = 10 \cdot lg\left(\frac{S_{eN}}{S_{nN}}\right)$$

The total signal-to-noise ratio of the even frequencies considered is then determined therefrom:

$$R_{Noise,e} = \frac{1}{N_{max}} \cdot \sum_{N=1}^{N_{max}} R_{NoiseN}$$

If this total signal-to-noise ratio is less than a predefined value Limit_$R_{Noise,e}$ in dB (for example: 6 dB), the noise component of the measurement signals makes the evaluation uncertain and the presence of a direct current component is then provided with an uncertainty factor or with a lower probability.

Prominent individual values of the even and/or odd frequencies can be determined as the second criterion for the usability of the measurement signals.

For this purpose, the two largest $S_{eN}$ values: $S_{emax1,A}$ and $S_{emax2,A}$ are first of all selected and a check is carried out in order to determine whether their ratio $$R_{emax}[dB(A)] = 10 \cdot lg\left(\frac{S_{emax1,A}}{S_{emax2,A}}\right)$$

is greater than a predefined value Limit_$R_{Se}$ (for example 10 dB (A)). In this case, there is a suspicion of interference or resonance of the even frequencies. The presence of a direct current component is then provided with an uncertainty factor or a lower probability.

Secondly, the same method is carried out for the two largest values of the odd frequencies. The two largest $S_{oN}$ values: $S_{omax1,A}$ and $S_{omax2,A}$ are selected and a check is carried out in order to determine whether their ratio $$R_{omax}[dB(A)] = 10 \cdot lg\left(\frac{S_{omax1,A}}{S_{omax2,A}}\right)$$

is greater than a predefined value Limit_$R_{So}$ (for example 10 dB (A)). In this case, there is the suspicion of interference or resonance of the odd frequencies. The presence of a direct current component is then provided with an uncertainty factor or a lower probability.

As the third criterion, it is investigated whether the fundamental oscillation excessively dominates, because this is an indication that the current noise does not originate from a direct current component, but rather is dominated by the fundamental oscillation. For this purpose, the following ratio is calculated:

$$R_{fund}[dB(A)] = 10 \cdot lg\left(\frac{S_{e1,A}}{S_{eTot-1,A}}\right)$$

If this ratio is greater than a predefined value Limit_$R_{fund}$ (for example 0 dB (A)), the presence of a direct current component is provided with an uncertainty factor or a lower probability.

The odd proportion of the frequencies is then determined as the fourth criterion which constitutes the main criterion for determining the direct current component. The following ratio is formed for this purpose:

$$R_{ons}[dB(A)] = 10 \cdot lg(S_{oTot,A}/S_{eTot,A})$$

If this ratio is below a first predefined value Limit_$R1_{ons}$ for example −9 dB (A), there is certainly no odd proportion and it is therefore determined that there is no direct current component.

If this ratio is above the first predefined value Limit_$R1_{ons}$ for example −9 dB (A), but is below a second predefined value Limit_$R2_{ons}$ for example −4 dB (A), there is a small odd proportion of frequencies and there is a suspicion of the presence of a direct current component with a particular probability.

If this ratio $R_{ons}$ is at or above the second predefined Limit_$R2_{ons}$ there is a high odd proportion of frequencies and therefore there is a significant suspicion of DC. The probability of the presence of a direct current component is then greater than when the ratio $R_{ons}$ is only between the first predefined value Limit_$R1_{ons}$ and the second predefined value Limit_$R2_{ons}$.

The probability of the presence of a direct current component, which is determined using the fourth criterion, can be accordingly reduced by the uncertainties or probabilities determined in the first to third criteria.

Finally, the evaluation in order to determine whether there is a direct current component can also be assessed by determining and stating the spectral quality. For this purpose, the evaluation is repeated with another spectral range. For this purpose, the number N of frequencies considered is varied, for example one frequency less, $N_{max}-1$, or three frequencies more, $N_{max}+3$. If 7 frequencies were therefore used during the first assessment of whether there is a direct current component, the same assessment is repeated again using 6 and/or 10 frequencies.

If the result, that is to say the probability of the presence of a direct current component, then still remains substantially the same, there is a spectrally robust result. Otherwise, there may be an assessment or output to the user indicating that the result is spectrally unstable or spectrally sensitive.

The invention claimed is:

1. A method for detecting a direct current component in an inductive device, transformer or inductor, the method comprising using a computer for:
   recording an oscillation signal of a sound emitted by the device or of a mechanical oscillation of the device;
   determining a frequency spectrum of the oscillation signal;
   determining a value of at least one odd harmonic in the frequency spectrum;
   comparing the value of the at least one odd harmonic with a value of at least one even harmonic in the frequency spectrum;
   determining a direct current component when the value of the at least one odd harmonic differs by a predefined extent from the value of the at least one even harmonic; and
   specifying a probability of a presence of a direct current component for determining the direct current component, and increasing the probability as an amount by which the value of the at least one odd harmonic differs from the value of the at least one even harmonic becomes greater.

2. The method according to claim 1, which further comprises predefining different differences for different probabilities of the presence of a direct current component.

3. The method according to claim 1, which further comprises comparing the value of one or more even harmonics with a value of a noise of the oscillation signal, and providing the presence of a direct current component with an uncertainty factor in an event of a difference being smaller than a predefined difference between the values.

4. The method according to claim 1, which further comprises relating two largest values of the even harmonics to one another, and providing the presence of a direct current component with an uncertainty factor in an event of a ratio being greater than a predefined ratio.

5. The method according to claim 1, which further comprises relating two largest values of the odd harmonics, not being equal to a fundamental frequency, to one another, and providing the presence of a direct current component with an uncertainty factor in an event of a ratio being greater than a predefined ratio.

6. The method according to claim 1, which further comprises relating a value of a fundamental oscillation to a value of remaining measured frequencies, and providing the presence of a direct current component with an uncertainty factor in an event of a ratio being greater than a predefined ratio.

7. The method according to claim 1, which further comprises assessing a presence of a direct current component with a lower probability when the value of the odd harmonic differs by a predefined extent from the value of the even harmonic and the difference increases with an increasing load current.

8. The method according to claim 1, which further comprises repeating the method with at least one of a different number of even harmonics or a different number of odd harmonics, and using a deviation as a measure of a robustness of a result when determining a direct current component.

9. A non-transitory computer program product, comprising a program to be directly loaded into a processor of a computer for carrying out the steps of claim 1 when executed by the processor.

* * * * *